US006208155B1

United States Patent
Barabi et al.

(10) Patent No.: US 6,208,155 B1
(45) Date of Patent: *Mar. 27, 2001

(54) PROBE TIP AND METHOD FOR MAKING ELECTRICAL CONTACT WITH A SOLDER BALL CONTACT OF AN INTEGRATED CIRCUIT DEVICE

(75) Inventors: Nasser Barabi, Lafayette; Siamak Jonaidi, San Jose, both of CA (US)

(73) Assignee: Cerprobe Corporation, Hayward, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,100

(22) Filed: Jan. 27, 1998

(51) Int. Cl.[7] .................................................. G01R 31/02
(52) U.S. Cl. ............................................. 324/754; 324/755
(58) Field of Search ..................................... 324/754, 755, 324/757

(56) References Cited

U.S. PATENT DOCUMENTS

| 4,700,132 | * | 10/1987 | Yarbrough et al. | 324/761 |
| 5,720,098 | * | 2/1998 | Kister | 29/825 |
| 5,804,984 | * | 9/1998 | Alcoe et al. | 324/761 |

* cited by examiner

Primary Examiner—Safet Metjahic
Assistant Examiner—Vincent Q. Nguyen
(74) Attorney, Agent, or Firm—Donald L. Beeson

(57) ABSTRACT

An improved probe tip for making electrical contact with a solder ball of an integrated circuit device such as a BGA includes two perimeter point structures having interior angled edges which form a front hollow region in the probe tip for receiving the solder ball of a BGA. Each of the interior edges of the point structures includes an angled medial contact zone which tangentially contacts the solder ball received in the hollow region of the tip to produce minimal distortion of the solder ball. The method of the invention permits electrical contact with a solder ball of a BGA with minimal deformation of the solder ball. In accordance with the method, the contact between the probe tip and the solder ball is limited to tangential contacts around the solder ball below the solder ball's apex.

16 Claims, 7 Drawing Sheets

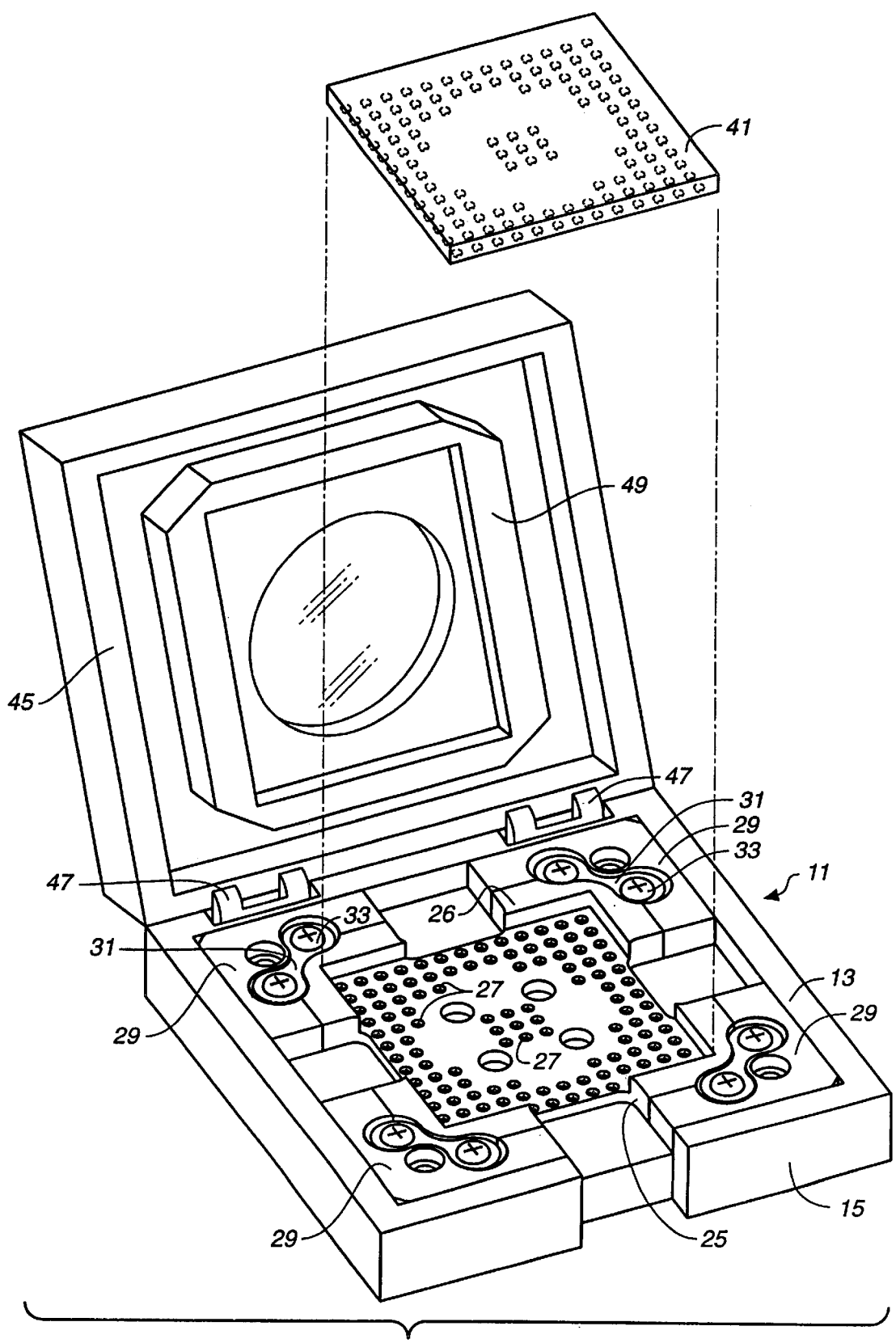
*FIG._1*

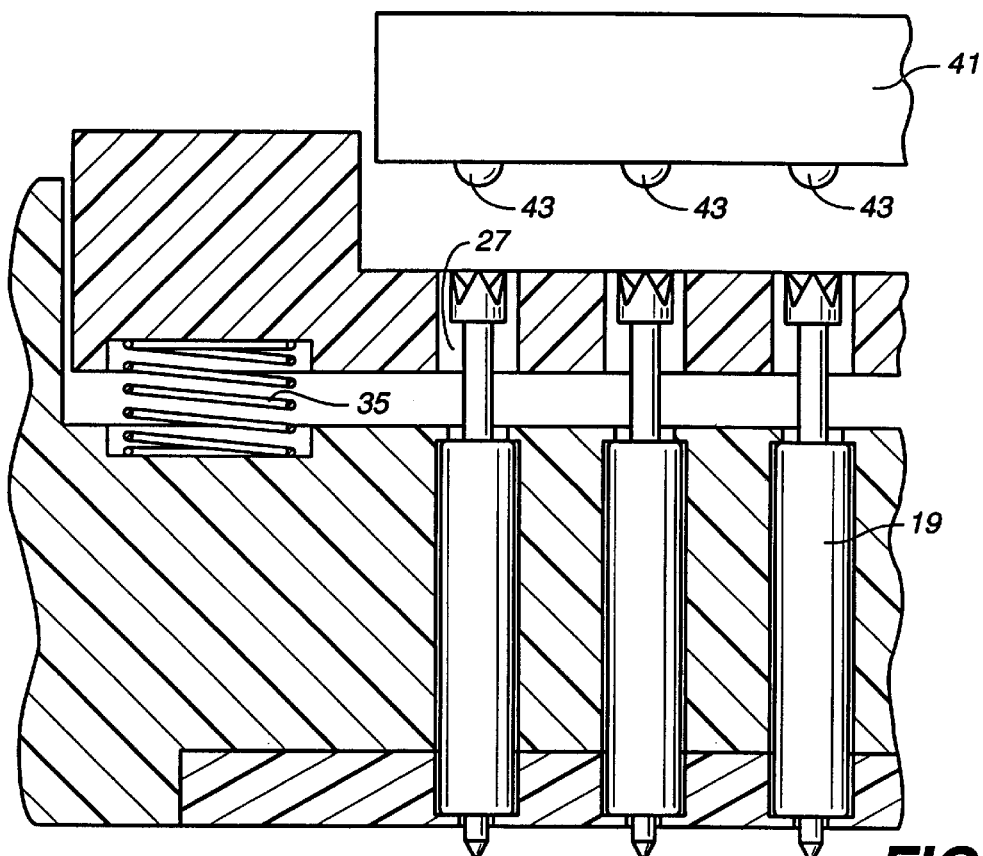
FIG._2A
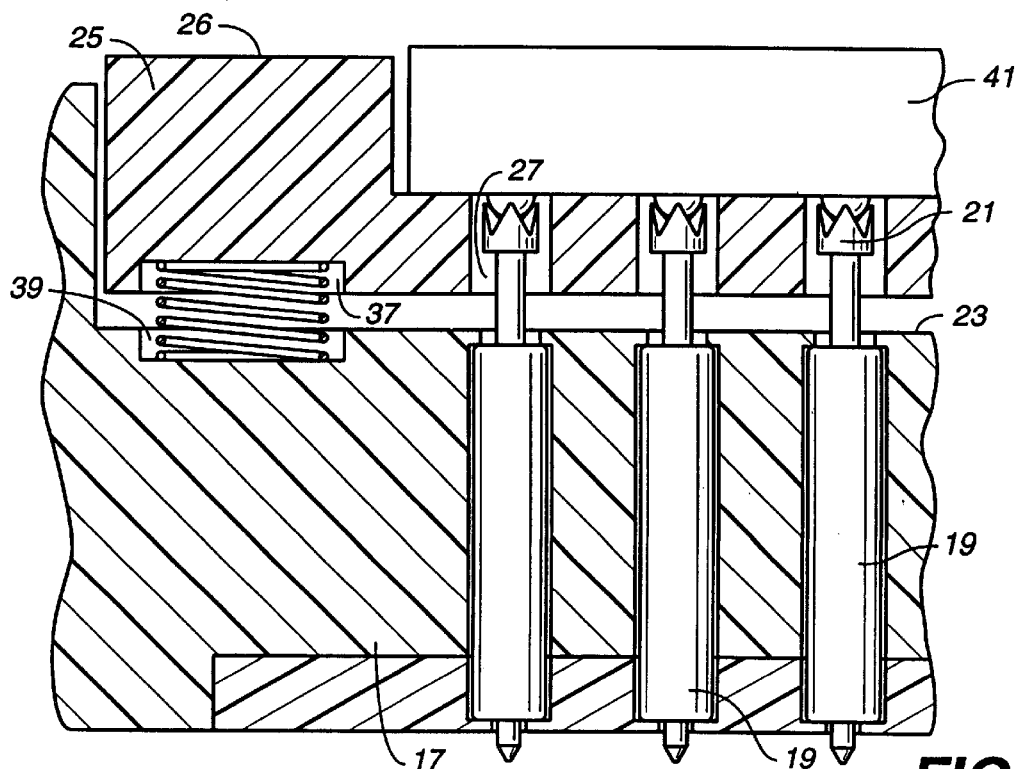
FIG._2B

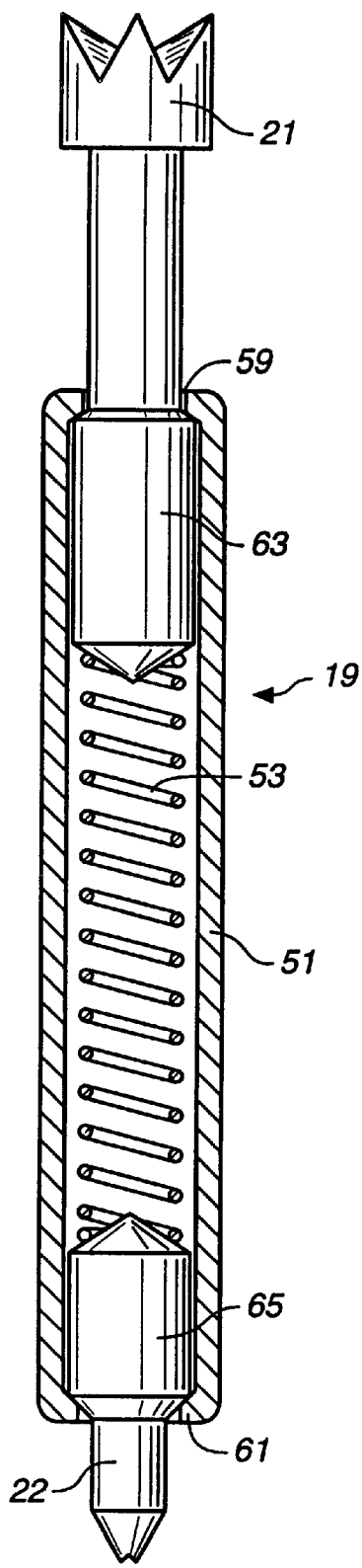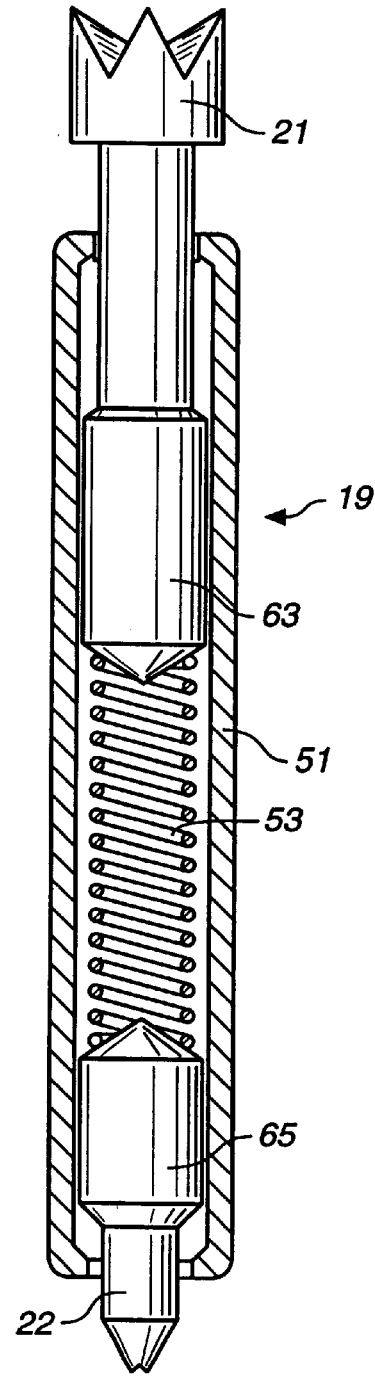
FIG._3A          FIG._3B

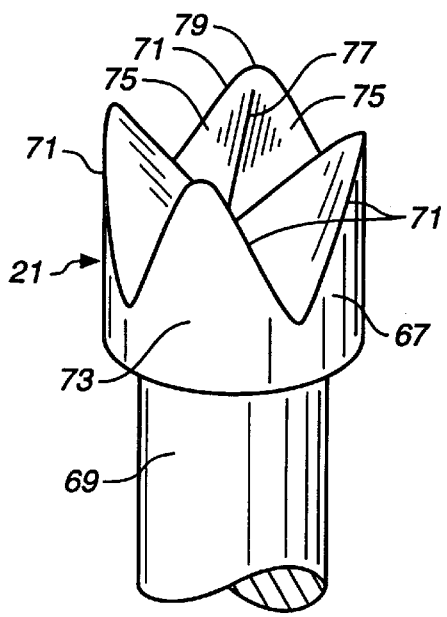
FIG._4
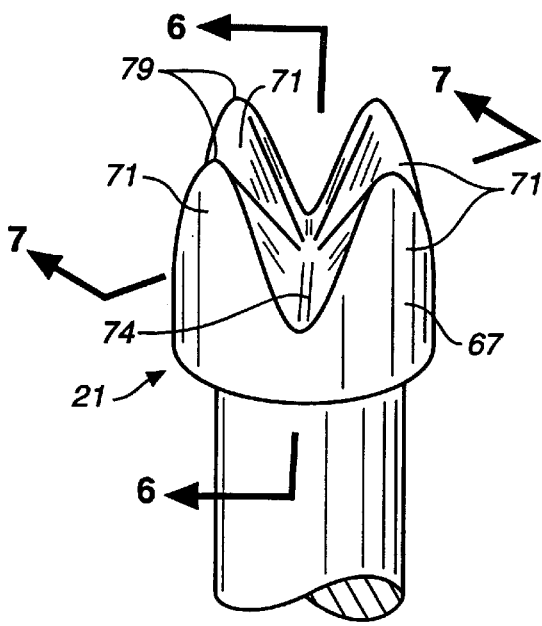
FIG._5
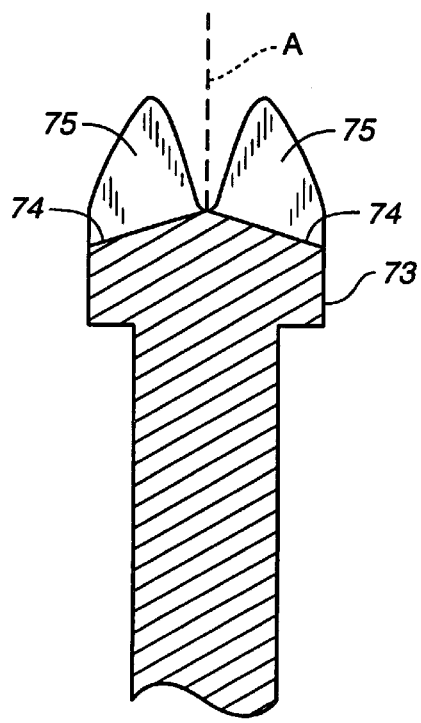
FIG._6
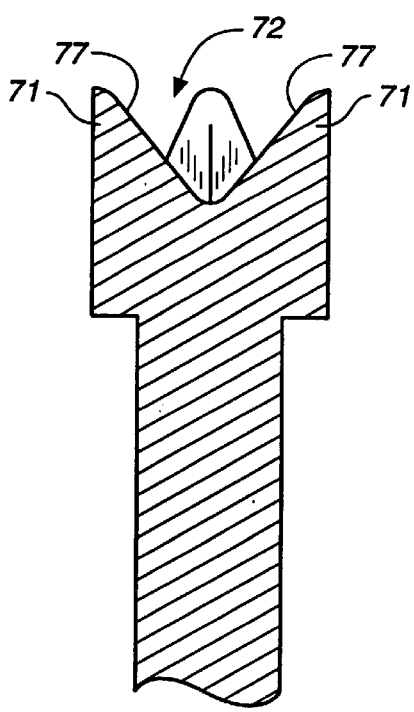
FIG._7

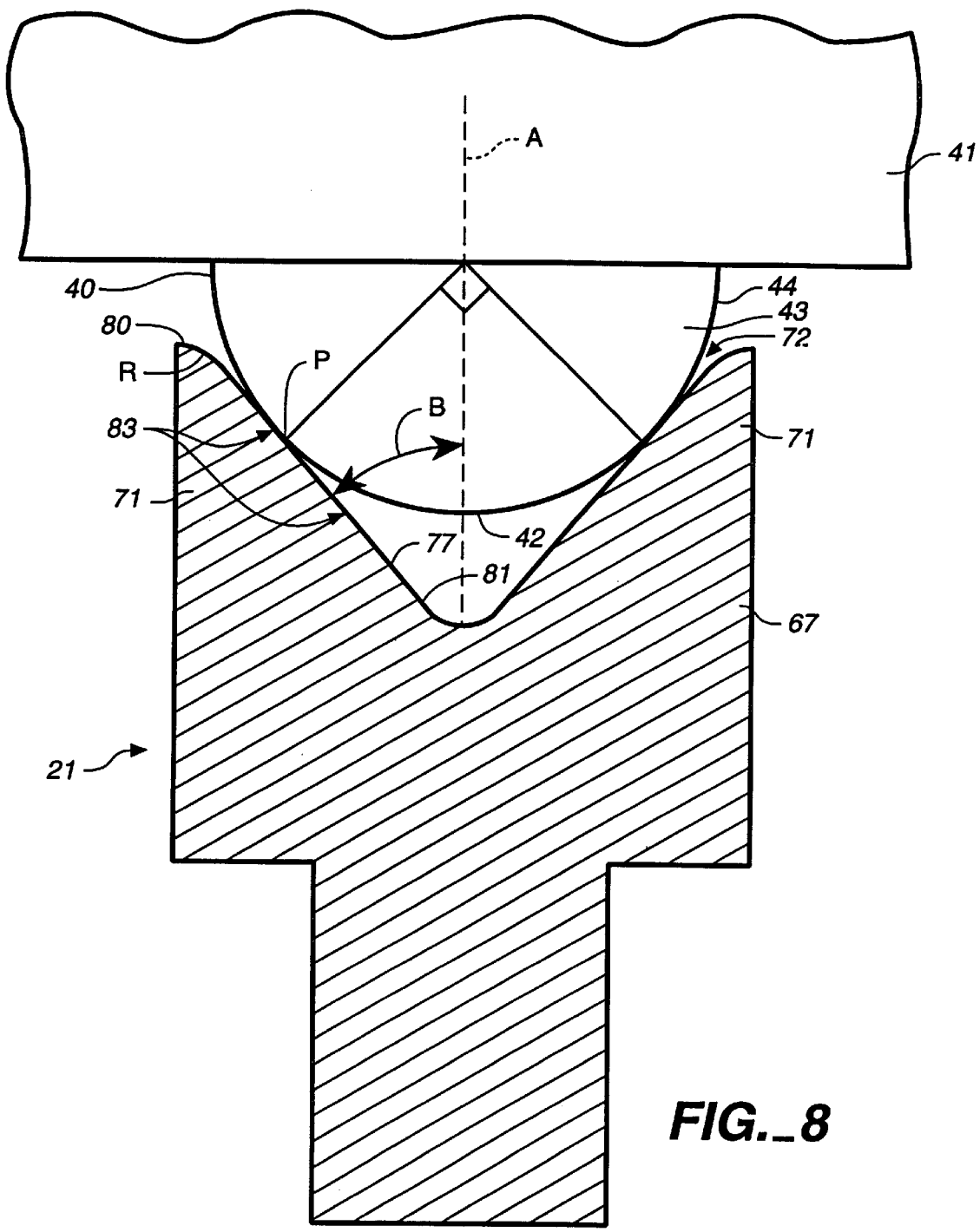
FIG._8

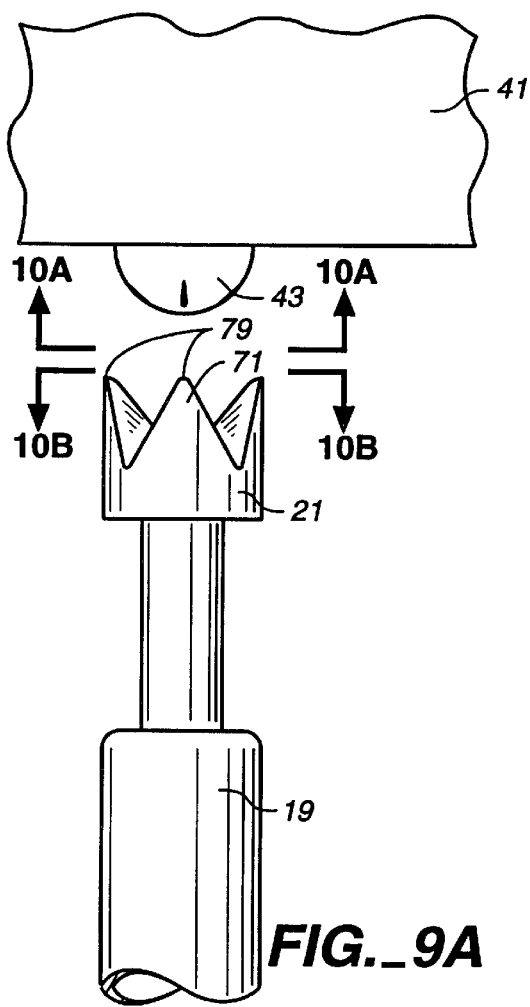
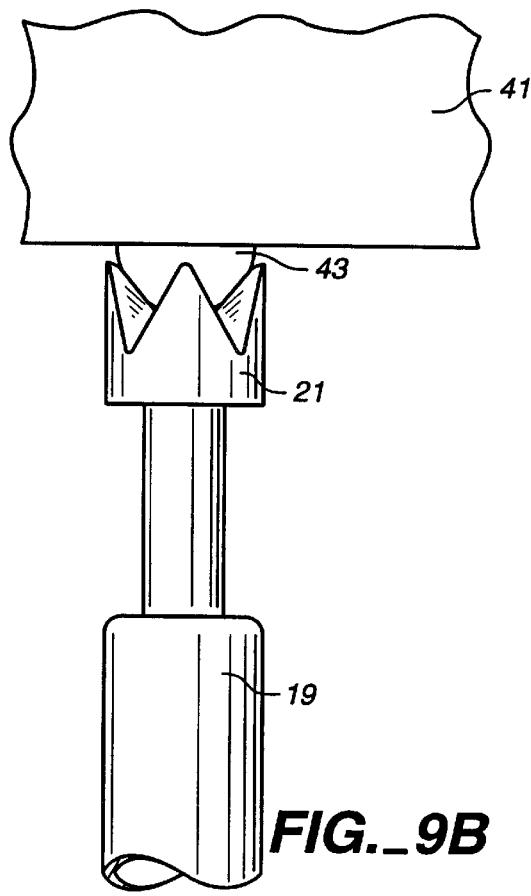
FIG._9A
FIG._9B
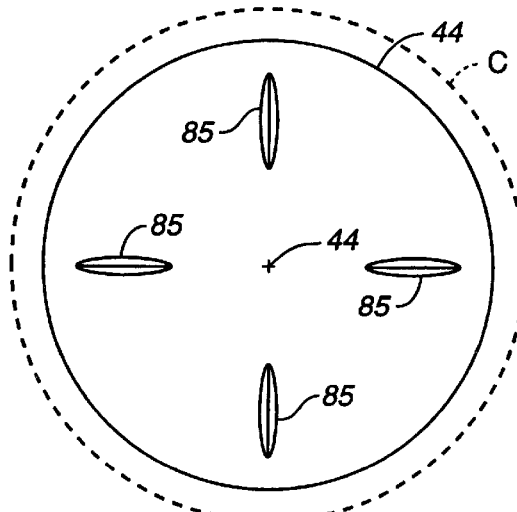
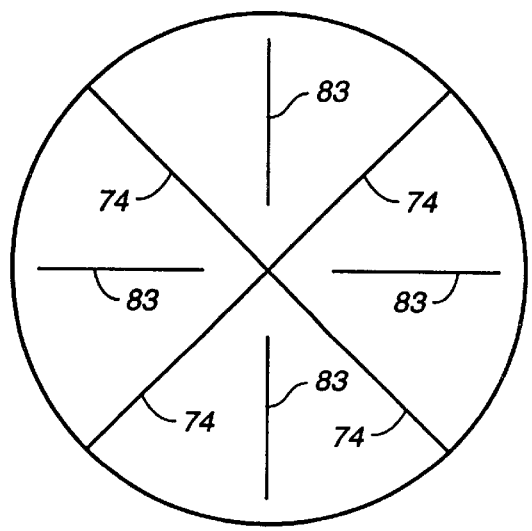
FIG._10A
FIG._10B

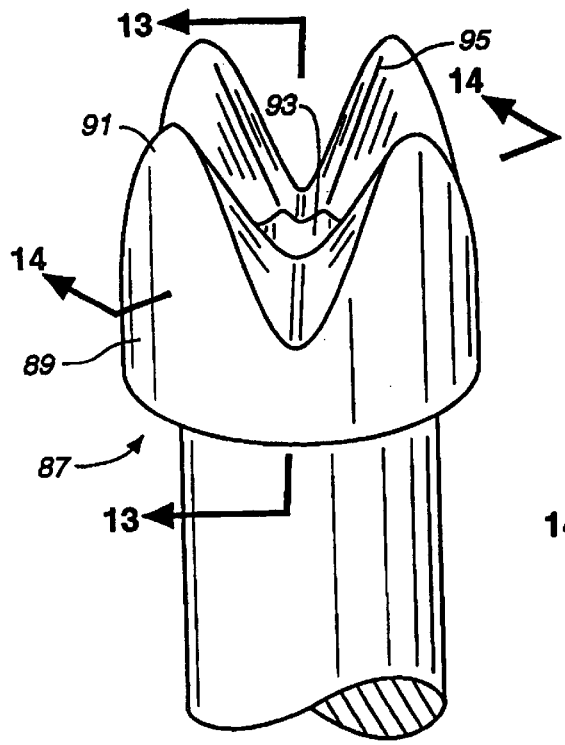
FIG._11
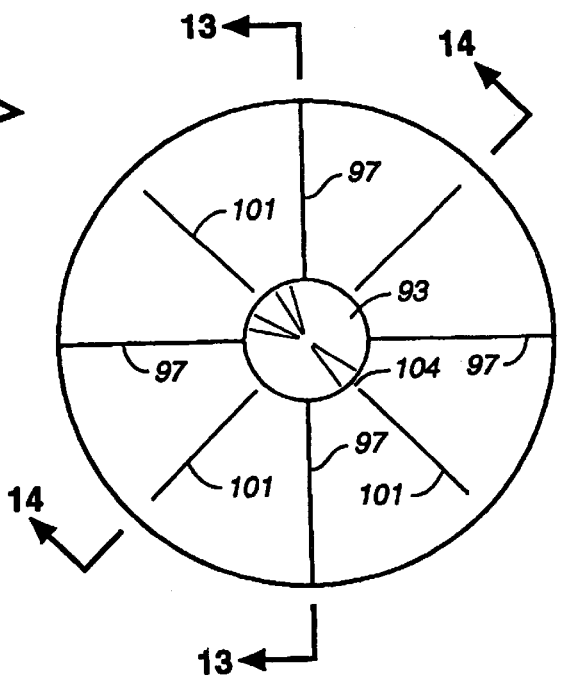
FIG._12
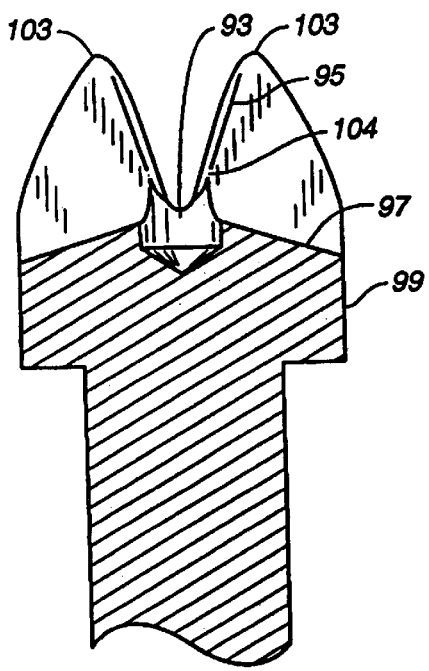
FIG._13
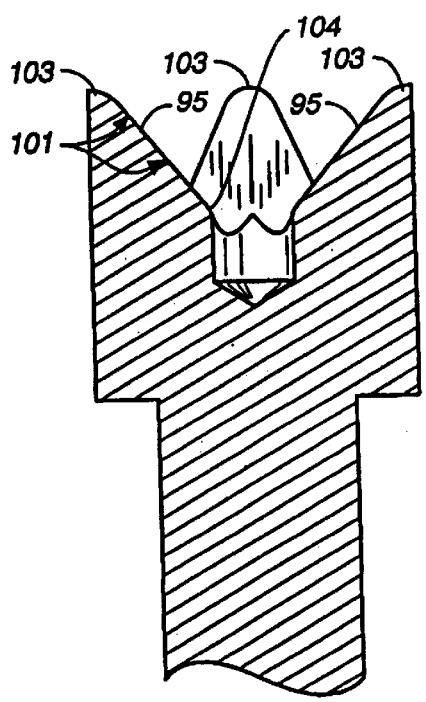
FIG._14

PROBE TIP AND METHOD FOR MAKING ELECTRICAL CONTACT WITH A SOLDER BALL CONTACT OF AN INTEGRATED CIRCUIT DEVICE

BACKGROUND OF THE INVENTION

The present invention generally relates to testing of integrated circuit (IC) devices, and more particularly to the design of pogo-pins used in socket test probes, contactors and the like for achieving reliable electrical contact with the solder ball contacts of an IC device. The invention has particular application in the testing of or interfacing with ball grid array (BGA) devices wherein electrical contact must be achieved with an array of densely packed solder ball contacts having spherical or hemispherical contact surfaces.

When testing IC devices a reliable electrical interface must be achieved between the test probes and the IC device in order to produce reliable test results. Testing devices typically utilize an array of individual conductive probes called "pogo pins", which provide a compliant contact array to electrically interface with the I/O contacts of the IC device. Generally, the tips of the pogo pins are designed to achieve efficient electrical contact between the pogo pin tip and the tested or contacted device, and to minimize the introduction of contact resistance in the signal path. However, little or no regard is given to the possible distortive effects of the probe on the I/O contacts themselves.

As IC packaging has become smaller, and I/O densities higher, ball grid arrays (BGAs) have emerged as an alternative IC packaging for integrated circuit devices having extended pin contacts. In BGA devices, the I/O contacts are provided in the form of an array of densely packed solder balls, which permit the device to be surface mounted to a circuit board. In addition to the efficiencies of surface mounting, BGAs permit smaller packaging for higher circuit densities and greater functionality with reliable electrical and thermal performance. On the other hand, with smaller BGA sizes come problems with testing. Specifically, in very small devices, known as micro-BGAs, solder balls are very small and have greatly reduced surface areas. In these devices the deformation of the solder balls caused by the probe contact is relatively large compared to the overall size of the balls, and this can detrimentally affect both the inspection and assembly of the device onto a printed circuit board. For example, excessive deformation of the solder balls can cause devices to be rejected during quality control procedures which may employ laser inspection techniques. Also, surface deformations can lead to problems in the integrity of the solder joints between the micro-BGA and the circuit board when the micro-BGA is mounted to the board.

Heretofore, probes used in the testing of BGA and micro-BGA devices have had probe tips with single or multiple points which dig into and around the apex of the BGA's solder balls. Such probe tips generally leave deep incision marks in the solder ball contacts and also deform the solder balls from their original shape. Furthermore, with such tip designs separation of the solder balls from the probe tips requires a degree of force that is generally undesirable. One reason for this is the relatively deep penetration of the points of the probe tips into the solder balls which causes the solder balls and probe tips to come into contact over a substantial surface area. Also, such probe tips are typically coated or plated with metallurgy, such as gold, that readily fuses or migrates into the soft solder material of a solder ball contact.

The present invention overcomes the problems associated with surface deformation of the solder ball contacts of a BGA device caused when the BGA's solder ball contacts are contacted by external conductive probes. The present invention further overcomes problems associated with the release force necessary to separate the BGA devices from external probes used to make electrical contact with such devices.

SUMMARY OF THE INVENTION

Briefly, the invention involves an improved probe tip for making electrical contact with the solder ball contacts of an IC device and particularly a BGA device. (As used herein, "BGA" is intended to refer to any BGA device, including mini-BGAs and micro-BGAs.) The invention also involves a method for making electrical contact with the circumferential surface of a solder ball in a manner that produces minimum distortion of the solder ball surface. A further aspect of the invention involves a socket employing probes having an improved probe tip in accordance with the invention.

The improved probe tip of the invention generally comprises a base portion and at least two point structures which extend from the tip's base portion. Each of the at least two point structures have a point end lying substantially on a defined perimeter circle which is centered about the center axis of the probe tip and which is sized to exceed the defined diameter of solder ball contact of a BGA or other IC device to be contacted by the probe tip. Each point structure provides an interior edge or edge contact facing the center axis of the probe tip and each of these interior edges provides a medial contact zone which is angled relative to the center axis for tangentially contacting the solder ball of the IC device below the apex of the solder ball. By contacting a solder ball below its apex with angled interior edge contacts rather than by the point contacts, and by limiting the medial contact zone of the interior edges which come into contact with the solder ball, distortion of the solder ball surface can be minimized. Further, any distortion that does occur occurs away from the apex of the solder ball where the solder ball first contacts the pad of a mother board to which the IC device is mounted. With minimal disturbance of the solder ball of the IC, the planarity of a solder ball array will be maintained, thereby decreasing the likelihood of a poor electrical connection at any solder ball joint.

Preferably, the solder ball contacts the interior edges of the probe tip point structures approximately 45 degrees below the apex of the solder ball. If the solder ball is contacted substantially above this angle, that is, closer to the apex, excessive distortion of the solder ball can result and will occur in a region of the ball having the greatest effect on solder ball planarity. Conversely, inefficient electrical contact with the solder ball is likely to result if contact is made too far down on the solder ball, that is, on surfaces near the solder ball's lateral circumference. To produce an optimum tangential contact, the angle of the medial contact zone of the interior edges of the point structures is preferably within a range of approximately 40–50 degrees relative to the center axis of the probe tip, and optimally, approximately 45 degrees. Further, to limit the medial contact zone to a portion of the overall interior edge of each point structure, each of the interior edges is provided with a receding portion at at least one of its extremities so as to limit the extent of the contact between the solder ball and the interior edge's medial contact zone. In one aspect of the invention, such receding area is provided in the form of a radius along the point end extremity of the point structure's interior edge, and in another aspect of the invention, such recessed area is provided in the form of a central cavity in the base portion of the probe tip into which the interior edge of the point structures terminate.

In the illustrated embodiment of the invention, the probe tip is shown as having four point structures for providing four interior edges which contact the solder ball at 90 degree intervals. It will be understood, however, that probe tips in accordance with the invention can be fabricated having different point structure counts, provided there are at least two point structures. Preferably, the point structures would have an equal angular spacing between them so as to provide a balanced structure which contacts a solder ball at edge contacts of equal angular spacings around the solder ball.

In accordance with the invention, the improved probe tip can additionally be provided with particulate dispersal regions or particulate collection regions for dispersing or collecting any form of particulate matter encountered in the probe tip environment which could affect the contact with a solder ball. In one aspect of the invention, a particulate dispersal region is provided in the form of particulate dispersal channels between the point structures which extend radially to the external perimeter of the base portion of the probe tip. A particulate collection region can be provided in the form of a center cavity in the base portion of the probe tip. As above mentioned, such center cavity also acts as a recessed area at the base end extremity of the interior edge of the point structures.

The socket of the invention is comprised of a frame having a transverse probe retention wall and an array of probes held in and extending through the retention wall, with each probe having a depressible probe tip having at least two point structures which provide interior edges as above described. The socket additionally includes a platform for holding an IC device, and specifically the solder ball contact array of an IC, over the interior surface of the frame's probe retention wall. The IC platform includes an array of guide holes running therethrough which corresponds to the array of probes held in the transverse wall of the frame, such that the projecting probe tips register with and extend into the array of guide holes in the platform when the platform is placed on the interior surface of the probe retention wall. The guide holes in the platform of the socket are sized to capture the ball contacts of an IC device registered therewith when the IC device is placed on the platform. A cover mechanism releasably holds the IC device against the platform so that the probe ends extending into the array of guide holes in the platform contact the solder balls registered with the guide holes. Due to the sizing of the probe tips relative to the solder balls as above described, the solder balls of the IC are contacted only along the medial contact zones of the interior edges of the point structures of each probe tip.

The method of invention involves a method of making electrical contact with the solder ball of an IC device, such as a BGA, with minimum distortion of the solder ball. The method is comprised of making tangential contact with a solder ball below its apex with at least two angled edge contacts, such as interior edge contacts formed on at least two point structures of a probe tip, and to do so without contacting the apex of the solder ball and without permitting the point ends of the point structures of a probe tip from contacting the solder ball. Preferably, the solder ball is contacted approximately 45 degrees below the solder ball's apex and preferably the contacts are balanced around the solder ball.

Therefore, it can be seen that it is a primary object of the present invention to provide an improved probe tip and method for contacting a solder ball contact of an IC device, such as a BGA, with minimal distortion of the solder ball. It is another object of the invention to contact a solder ball with minimal distortion, while producing an efficient electrical contact. Other objects and advantages of the invention will be apparent from the following specification claims as well as the accompanying drawings illustrating the best mode of the invention.

DESCRIPTION OF THE DRAWINGS

FIG. 1 is a top perspective view of an IC test socket for testing a BGA device.

FIG. 2A is fragmentary cross-sectional view thereof in side elevation, showing how pogo pins in accordance with the invention are deployed therein.

FIG. 2B is another fragmentary cross-sectional view thereof in side elevation, showing a BGA device operatively placed in the test socket.

FIG. 3A is a side elevational view in partial cross-section of a pogo pin having a probe tip in accordance with the invention.

FIG. 3B is another side elevational view thereof showing the probe tips of the pogo pin depressed against the pogo pin's internal compression spring.

FIG. 4 is a top perspective view of the probe tip of the pogo pin shown in FIGS. 3A and 3B.

FIG. 5 is a rotated top perspective view thereof.

FIG. 6 is a cross-sectional view thereof taken along section lines 6—6 of FIG. 5.

FIG. 7 is a cross-sectional view thereof taken along section lines 7—7 of FIG. 5.

FIG. 8 is an enlarged schematic representation of the probe tip contacting a solder ball of a BGA device.

FIG. 9A is a partial side elevational view of a probe tip in accordance with the invention in opposition to a solder ball of a BGA device to be tested.

FIG. 9B is a side elevational view of the probe tip of FIG. 9A in contact with the solder ball.

FIG. 10A is a bottom plan view of a solder ball such as shown in FIGS. 9A and 9B, showing displacement marks made by the probe tip of the invention, and showing the perimeter circle which defines the radial location of the point ends of the probe tip.

FIG. 10B is a graphical representation of the probe tip of FIGS. 9A and 9B, as seen in a top plan view.

FIG. 11 is a top perspective view of a probe tip in accordance with the invention, showing an alternative embodiment thereof.

FIG. 12 is a graphical representation of the probe tip shown in FIG. 11, as seen in a top plan view.

FIG. 13 is a cross-sectional view thereof in side elevation, taken along lines 13—13 of FIG. 12.

FIG. 14 is a cross-sectional view thereof in side elevation, taken along lines 14—14 of FIG. 12.

DETAILED DESCRIPTION OF THE INVENTION

Referring now to the drawings, FIGS. 1, 2A and 2B generally illustrate a test socket for testing a BGA device using test probes having an improved tip design in accordance with the invention. Test socket 11 includes a frame 13 having a perimeter 15 and a transverse probe retention wall 17 for holding an array of probes in the form of pogo pins 19, each of which has a depressible probe tip 21 which projects internally of the socket from the interior surface 23 of the frame's retention wall. An interior IC platform 25 has an array of guide holes 27 which register with the projecting tips 21 of pogo pins 19. This platform is positioned over the frame wall 17 by means of corner blocks 29 and is retained in the frame by retention clips 31 which are fastened in place by screw fasteners 33. Mounting springs 35 placed into opposed recesses 37, 39 at suitably distributed locations around platform 25 and frame wall 17 allow the platform to be depressed toward the interior surface of the frame wall. Hence, platform 25 can be described as a "floating" platform which floats relative to the internally projecting probe tips of the frame.

The manner in which a BGA device is loaded into socket 11 is generally illustrated in FIGS. 1, 2A and 2B. The BGA device 41 to be tested is inserted in the socket by placing it on the socket's platform 25 such that the solder ball contacts 43 at the bottom of the BGA fit into and are captured by the platform's guide holes 27. The BGA, which is in the form of a square semiconductor chip, is held in its proper aligned position over the platform's guide holes by means of raised corner guides 26, while socket cover 45, which is connected to the socket frame 13 by hinges 47, provides a means for holding the BGA device onto the floating platform. The socket cover also depresses the BGA and floating platform against mounting springs 35 such that the probe tips 21 registered with and extending into the platform's guide holes come into contact with the BGA's array of solder balls as illustrated in FIG. 2B. It is specifically seen that the BGA and floating platform are depressed downward together as a unit by means of depressor ring 49 formed on the interior of the socket cover.

Suitably, the frame, floating platform, and cover of the socket are all fabricated of a high temperature plastic material such as Torlon®, available from Amoco Polymers, Inc.

The improved probe tip and method of the invention are now described in greater detail with reference to FIGS. 3–14 of the drawings. Referring to FIGS. 3A and 3B, it is seen that pogo pin probes 19 generally include an elongated spring barrel 51, compression spring 53, and probe tips 21, 22 which extend from piston ends 63, 65 captured inside the crimped ends 59, 61 of the spring barrel. The internal compression spring 53 is compressed between the piston ends of the probe tips to hold the probe tips in the normally extended position shown in FIG. 3A. When the probe tips are contacted, they will depress against the restoring force of compression spring 53 as shown in FIG. 3B to provide a compliant contact.

Referring to FIGS. 4–8, the internally projecting probes tips 21 of pogo-pins 19 are each located at the end of a plunger shaft 69 having sufficient length to position the probe tips a suitable distance above interior surface 23 of frame wall 17 to allow contact with the IC device solder balls through the guide holes of IC platform 25. Each probe tip 21 is comprised of a base portion 67 and perimeter point structures 71 extending from the base portion about the center axis of the probe tip. (The center axis of the probe tip is denoted by the letter A in FIGS. 6 and 8.) Each of the perimeter point structures 71 is, in turn, defined by intersecting surfaces consisting of the probe tip's outside perimeter surface 73 and two interior angled faces 75. The intersection of interior faces 75 form an interior edge contact for making a tangential contact with a solder ball. Specifically, the interior faces of the four perimeter point structures form four interior edges 77, all of which face the center axis A of the probe tip. These edges are seen to form a front hollow region 72 at the end of the probe tip for receiving the solder ball to be contacted.

Each of the point structures 71 of probe tip 21 terminates at a point end 79 which, as further described below, lies on a perimeter circle centered about the probe's center axis. As will be discussed, the sizing of this perimeter circle is critical to the practice of the invention since it allows interior edges 77 of the point structures to provide the desired tangential contact with the BGA.

In accordance with the invention, the solder balls 43 of the BGA device 41 are contacted tangentially by the probe tip 21 along the interior edges of the tip's perimeter point structures 71, and only along these interior edges. The manner of contact is best illustrated in FIG. 8 where it is seen that interior edges 77 of perimeter point structures 71 have a point end extremity 79, a base end extremity 81, and a medial contact zone 83 between these extremities. The medial contact zone of the interior edges 77 may extend substantially the length of the interior edge, however, it is generally desirable to limit the extent of this contact zone to minimize deformation of the solder ball. As best shown in FIG. 8, this can be accomplished by providing a receding area in the form of a radius R at the point end extremity of the interior edges 77. This radius will minimize the possibility that the point ends will puncture or gouge into the solder balls as the solder balls are brought into contact with the tip of the probe. The base end extremities of interior edges 77 can likewise be provided with a receding area as further described below in connection with the embodiment of the invention shown in FIGS. 11–14 below.

It is seen that the front hollow region 72 at the end of the probe tip receives solder ball 43, allowing the solder ball to extend into the probe tip until it comes into contact with the interior edges 77 of the tip's point structures 71. As shown in FIG. 8, the outer surface 40 of the solder ball is contacted tangentially at a position between the solder ball's apex 42 and its lateral circumference 44. For a perfectly spherical solder ball, the location of the tangential contact P below the solder ball apex 42 will be determined by the angle of the medial contact zones 83 of the interior edges 77 of the point structures 71. To achieve minimum distortion of the solder ball, the angle of the medial contact zone of each point structure relative to the center axis A of the probe tip (as denoted by the angle B in FIG. 8) should be in a range of approximately 40 to 50 degrees, with an optimum angle of around 45 degrees. When angle B is 45 degrees, the medial contact zone of interior edges 77 will tangentially contact the solder ball at a position P which is 45 degrees below its apex.

The use of the improved probe tip of the invention and the method of the invention can further be described in reference to FIGS. 9 and 10 wherein FIGS. 9A and 9B show a pogo pin probe tip 21 in accordance with the invention contacting a solder ball 43, and wherein FIGS. 10A and 10B show the location of the resulting tangential contact marks on the solder ball.

Referring to FIG. 9A, to contact solder ball 43 of BGA device 21, the tip 41 of pogo pin probe 19 is positioned in opposition to the solder ball such that the center axis of the probe tip generally aligns with the apex 42 of the solder ball. In this position, it can be seen that the point ends 79 of the tip's point structure 71 lie on a perimeter circle, shown in FIG. 10A as phantom circle "C", having a diameter that exceeds the diameter of the solder ball. When the probe tip is moved into contact with the solder ball as illustrated in FIG. 9B, the medial contact zones 83 of the tip's interior edges 77 tangentially contact the circumferential surface of solder ball 43 at a position midway between the solder ball apex 42 and its lateral circumference 44, making relatively small tangential displacement marks 85 which, as shown in FIG. 10A, extend longitudinally relative to the solder ball's apex. It is noted that the four displacement marks 85 are made not only below the solder ball's apex, but at 90 degree intervals about the apex, in correspondence with the 90 degree spacing of the four balanced perimeter point structures of the probe tip. While four point structures providing four interior edges are believed to provide the optimum number of contact points around the solder ball, it is understood that fewer point structures can be used, as well as a greater number of point structures, so long as there are at least two point structures, and preferably so long as the point structures are evenly spaced around the probe's center axis to provide a balanced probe tip. The use of four point structures generally provides a sufficient number of displacement points around the solder ball to achieve an efficient electrical contact between the probe tip and the solder ball while minimizing the distortion effects that the probe tip has on the solder ball. Probe tips having a greater number of point structures generally would be more difficult to manufacture, and would generally increase the tendency of the probe tip to grab or stick to the solder ball when the solder ball is retracted from the probe tip. Any tendency to grab or stick is undesirable since it can lead to distortion of the solder ball as the solder ball and probe tip separate from each other. It also increases the difficulty of removing a BGA device from a test socket.

The composition of the probe tip will be important to the electrical and mechanical characteristics of the tip. The tip's surfaces preferably are covered with a conductive material that provides a microscopically smooth and non-porous surface which will not have a tendency to diffuse or migrate into the contacted solder ball and which will not stick to the solder ball as the solder is separated from the tip. Preferably the probe tip is fabricated of a base material such as stainless steel or a softer beryllium copper (depending on application) which is electroplated with a conductive material such as rhodium or boron. It is found that rhodium provides a highly suitable surface for meeting the objectives of the probe tip.

Another feature of the improved probe tip of the invention is its ability to remove foreign particulate matter from the region of the contact points P made between the probe tip 21 and the solder ball 43. Such foreign particulate matter can be in the form of residue generated from the contact itself, such as when the contact disturbs an oxidized layer on the surface of the solder ball, or from environmental sources. Whatever the source, the foreign matter, if allowed to accumulate, can detrimentally affect the electrical and mechanical contact between the solder ball and the probe tip.

Referring to FIGS. 5 and 6, it is seen that dispersal regions for evacuating foreign particulate matter from the probe tip is provided in the form of radial channels 74 formed at the bottom of the point structures of the tip, specially by interior faces 75 of adjacent point structures. Referring to FIG. 6, it can be seen that each of the radial channels 74 extends in a downward slope from the center axis A of the probe tip to the probe tip's external perimeter surface 73. These radial channels have a smooth electroplated surface which will allow particulate matter collecting therein to be conveyed by gravity out through the tip perimeter. In the embodiment illustrated in FIGS. 5 and 6, the probe tip will be provided with four radial dispersal channels 90 degrees apart as graphically illustrated in FIG. 10B.

Referring to FIGS. 11–14, an alternative embodiment of the probe tip of the invention is shown wherein probe tip 87, having a base portion 89 and four point structures 91 extending therefrom, includes a center cavity 93, suitably formed by a drilling operation, in the tip's base portion 89 at the base end extremities of the point structure's interior edges 95. Downward sloping radial channel regions 97 are formed between point structures 91, and extend from center cavity 93 to the probe tip's perimeter surface 99. Cavity 93 provides two functions: it limits the base end extremity of interior edges 95 of the point structures by allowing these interior edges to recede into the cavity structure, and it provides a reservoir for foreign particulate matter that migrates toward the center of the probe tip. Foreign particular matter gathered in this cavity is allowed to disburse through the four channel regions 97 graphically illustrated in FIG. 12. In the embodiment of the probe tip illustrated in FIGS. 11–14, the medial contact zone 101 of the interior edges of the tip's point structures extends from the end of the radius at point end extremity 103 of the point structures to center cavity 93. This configuration will prevent contact with a solder ball at the extremities of the interior edges 95 where interior edges can have the greatest distortive effect on the solder ball. Preferably, bottom corner 104 of each interior edge is rounded or chamfered to further reduce the reach of the edge's medial contact zone and to eliminate undesirable sharp corners along the interior edge.

In the embodiment of the probe tip illustrated in FIGS. 4–10, the angle of interior edges 95 relative to the axis of the probe tip will preferably be in the range of 40–50 degrees to achieve contact with a solder ball contact at the desired location below the apex of the solder ball as above described.

Therefore, it can be seen that the present invention provides for an improved probe tip and method for contacting the solder balls of a BGA device which minimizes the distortion of the solder ball while at the same time providing an efficient electrical contact between the solder balls and the probe tip. A probe tip is also provided which is capable of collecting and dispersing foreign particulate matter from contact regions of the probe tip and which minimizes the force necessary to separate the solder ball from the probe tip. While the invention has been described in considerable detail in the foregoing specification and the accompanying drawings, it is understood that it is not intended that the invention be limited to such detail, except as necessitated by the following claims.

What is claimed is:

1. A test socket for an integrated circuit (IC) device having solder ball contacts comprising a frame having a transverse probe retention wall and an array of probes held in and extending through said retention wall, said probe retention wall including an interior surface and said probes including depressible tips which project from said interior surface, a floating IC platform for depressibly holding an IC device in said frame over the interior surface of the frame's probe retention wall, said floating platform having an array of guide holes therethrough corresponding to the array of probes held in the probe retention wall of said frame, and said floating platform further being positioned over the interior surface of said probe retention wall such that the array of guide holes in said platform registers with said probe array and such that the projecting tips of said probes extend into said array of guide holes and are captured thereby, the guide holes in said IC platform being sized to receive and capture solder ball contacts registered therewith when an IC device to be tested is placed against said platform thereby causing the solder ball contacts to register with the projecting probe tips extending into said guide holes, and a cover mechanism for releasably holding an IC device against said platform during the testing thereof, the projecting tips of the probes of each said probe array being comprised of a base portion having an external perimeter sized to pass through the guide holes of said IC platform, at least two perimeter point structures extending from said base portion to form a centered front hollow region for receiving solder balls captured in the guide holes of said IC platform, each of said point structures having a point end lying substantially on a defined perimeter circle which is centered about the center axis of the probe tip and which is sized to exceed the defined diameter of the solder ball contacts captured in said guide holes, and each of said point structures further having an interior edge facing the center axis of the probe tip, said interior edge having a point end extremity, a base end extremity, and a medial contact zone therebetween which is angled relative to the center axis of the probe tip for contacting a solder ball contact below the apex thereof when a solder ball contact captured in a guide hole of the IC platform is received in the front hollow region of the probe tip.

2. The test socket of claim 1 wherein a particulate dispersal region is provided in the base portion of the probe tips for dispersing foreign particulate matter from the probe tips through the external perimeter of said base portion.

3. The test socket of claim 1 wherein the point end extremity of the interior edge of each point structure of each projecting probe tip has a radius so as to limit the reach of the medial contact zone of the interior edges of said point structures.

4. The test socket of claim 3 wherein the medial contact zone of the interior edge of each point structure of said probe tips has an angle relative to the center axis of said tip in a range of approximately 40 to 50 degrees.

5. The test socket of claim 1 wherein a particulate collection region is provided at the base portion of the probe tip.

6. The test socket of claim 5 wherein said particulate collection region includes a particulate collection cavity formed in the base portion of the probe tips behind the front hollow region formed by the interior edges of said perimeter point structures.

7. A method of making electrical contact with solder ball contacts of an integrated circuit (IC) device with minimum deformation of the solder ball contacts, wherein each said solder ball contacts has a defined apex and a lateral circumference, said method comprising providing conductive probe tips having angled interior edges facing the center axis of the probe tips which define a centered front hollow region of the probe tips for receiving solder ball contacts of an IC device, inserting said probe tips into guide holes of a platform for the IC device, selecting an IC device having solder ball contacts sized to fit within the front hollow region of the probe is, said solder ball contacts further being sized to fit within and to be captured by the guide holes of said platform in opposition to the probe tips inserted therein, and contacting the solder ball contacts by said probe tips such that the only contact between the solder ball contacts and the probe tips occur within said guide holes and are tangential contacts between the solder ball contacts and the interior edges of the probe tips, and such that such tangential contacts occur below the apex of said solder ball contacts.

8. The method of claim 7 wherein the tangential contacts between said solder ball contacts and said probe tips occur approximately midway between the apex and the lateral circumference of the solder ball contacts.

9. The method of claim 7 wherein the interior edges of the probe tips extend longitudinally of the center axis of the probe tips to produce longitudinal tangential displacement marks on said solder ball contacts relative to the apex thereof.

10. The method of claim 7 wherein the interior edges of the probe tips have substantially equal angular spacings about the center axis of the probe tip to provide balanced contacts between the probe tip and solder ball contacts about the apex of the solder ball contact.

11. The method of claim 10 wherein four interior edges are provided for providing four tangential contacts at ninety degree intervals about the solder ball contact.

12. A method of making electrical contact with a solder ball contacts of an integrated circuit (IC) device with minimum deformation of the solder ball contacts, wherein each said solder ball contact has a defined apex and a lateral circumference approximately ninety degrees from said apex, said method comprising providing an array of probes each with a conductive probe tip having a center axis and at least two extending point structures, each of said point structures including a point end lying substantially on a defined perimeter circle that exceeds the diameter of the solder ball contact of the IC device to be contacted, and an interior edge that faces the center axis of the probe tip and that extends to the point end of said point structure, placing the IC device on a depressible floating platform having an array of guide holes for receiving the solder ball contacts of said IC devices, positioning the tips of the probes of said probe array in opposition to the solder ball contacts of the IC device within the guide holes of said floating platform, and moving the the IC device on the floating platform to bring the solder ball contacts thereof into contact with the probe tips of said probe array such that the solder ball contacts are only contacted tangentially by the interior edges of the tip of said probe, the extension of the point ends of the point structures of said probe tip being sufficiently limited to prevent said point ends from coming into contact with the IC device.

13. The method of claim 12 wherein said probe tip has four point structures providing four interior edges for contacting the solder ball contact.

14. The method of claim 12 wherein the interior edges of the point structures of the probe tip have substantially equal angular spacings about the center axis of the probe tip to provide balanced contacts between the probe tip and solder ball contact about the apex of the solder ball contact.

15. The method of claim 12 wherein the surfaces of the solder ball contacts of the IC device are contacted by a medial contact zone of the interior edges of said probe tips.

16. The method of claim 15 wherein the medial contact zone of the interior edge of each said point structure has an angle relative to the center axis of the probe tip of between approximately 40 to 50 degrees so as to contact the solder ball contact a substantial distance from both the apex and the lateral circumference of the solder ball contact.

* * * * *